United States Patent
Yamashita

(10) Patent No.: US 11,772,632 B2
(45) Date of Patent: Oct. 3, 2023

(54) DETERIORATION EVALUATION APPARATUS AND DETERIORATION EVALUATION METHOD FOR SECONDARY BATTERY

(71) Applicant: TOYOTA JIDOSHA KABUSHIKI KAISHA, Toyota (JP)

(72) Inventor: Yoshiya Yamashita, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 289 days.

(21) Appl. No.: 17/231,346

(22) Filed: Apr. 15, 2021

(65) Prior Publication Data

US 2021/0394744 A1    Dec. 23, 2021

(30) Foreign Application Priority Data

Jun. 18, 2020  (JP) ................. 2020-105545

(51) Int. Cl.
*B60W 20/50*   (2016.01)
*B60L 58/16*   (2019.01)
*B60K 6/28*    (2007.10)

(52) U.S. Cl.
CPC ............. *B60W 20/50* (2013.01); *B60K 6/28* (2013.01); *B60L 58/16* (2019.02); *B60W 2510/06* (2013.01); *B60W 2510/248* (2013.01); *B60W 2540/10* (2013.01)

(58) Field of Classification Search
CPC ............. B60W 20/50; B60W 2510/06; B60W 2510/248; B60W 2540/10; B60L 58/16; B60K 6/28
See application file for complete search history.

(56) References Cited

U.S. PATENT DOCUMENTS

| | | | |
|---|---|---|---|
| 2014/0081499 A1* | 3/2014 | Ito | B60W 20/13 180/65.265 |
| 2017/0003352 A1* | 1/2017 | Barre | G01R 31/007 |
| 2021/0021000 A1* | 1/2021 | Sada | H01M 50/249 |

FOREIGN PATENT DOCUMENTS

JP    2013-038977 A    2/2013

\* cited by examiner

*Primary Examiner* — James J Lee
*Assistant Examiner* — Steven Vu Nguyen
(74) *Attorney, Agent, or Firm* — Sughrue Mion, PLLC

(57) ABSTRACT

A deterioration evaluation apparatus for a secondary battery, which evaluates a degree of deterioration of the secondary battery of a hybrid vehicle including an engine that outputs a driving power, a motor that outputs a driving power, and the secondary battery configured to exchange an electric power with the motor, includes one or more processors configured to evaluate the degree of deterioration of the secondary battery based on a first relationship. The first relationship is set by using an accelerator operation amount and an operation point. The operation point includes a rotation speed of the engine and a load factor of the engine. The first relationship is a relationship between the operation point and a load on the secondary battery when the engine is operated at the operation point.

6 Claims, 7 Drawing Sheets

DETERIORATION EVALUATION APPARATUS AND DETERIORATION EVALUATION METHOD FOR SECONDARY BATTERY

CROSS-REFERENCE TO RELATED APPLICATION

This application claims priority to Japanese Patent Application No. 2020-105545 filed on Jun. 18, 2020, incorporated herein by reference in its entirety.

BACKGROUND

1. Technical Field

The present disclosure relates to a deterioration evaluation apparatus and deterioration evaluation method for a secondary battery and, more specifically, to a deterioration evaluation apparatus and deterioration evaluation method for a secondary battery, which evaluate the degree of deterioration of a secondary battery of a hybrid vehicle including an engine, a motor, and the secondary battery.

2. Description of Related Art

Generally, an apparatus that evaluates the deterioration of a secondary battery based on a power of the secondary battery has been suggested as a kind of deterioration evaluation apparatus for a secondary battery (see, for example, Japanese Unexamined Patent Application Publication No. 2013-038977 (JP 2013-038977 A)). The apparatus evaluates the deterioration of a secondary battery by, when the temperature of the secondary battery is higher than a predetermined temperature and a required power of the secondary battery is higher than a predetermined power, adding a first-order lag characteristic to the required power and then outputting a battery power.

SUMMARY

Incidentally, in a hybrid vehicle including an engine that outputs a driving power, a motor that outputs a driving power, and a secondary battery that exchanges an electric power with the motor, the power of the motor, that is, the power of the secondary battery, varies depending on the state of operation of the engine. For this reason, it is presumable that the degree of deterioration of the secondary battery varies with the state of operation of the engine. The above-described deterioration evaluation apparatus for a secondary battery is desired without consideration to such a state of operation of the engine, so the deterioration evaluation apparatus may not be able to accurately evaluate the degree of deterioration of the secondary battery.

The present disclosure provides an evaluation apparatus and evaluation method that further accurately evaluate the degree of deterioration of a secondary battery.

The deterioration evaluation apparatus and deterioration evaluation method for a secondary battery according to aspects of the disclosure are configured as follows.

An aspect of the disclosure relates to a deterioration evaluation apparatus for a secondary battery, which evaluates a degree of deterioration of the secondary battery of a hybrid vehicle including an engine that outputs a driving power, a motor that outputs a driving power, and the secondary battery configured to exchange an electric power with the motor. The deterioration evaluation apparatus includes one or more processors configured to evaluate the degree of deterioration of the secondary battery based on a first relationship. The first relationship is set by using an accelerator operation amount and an operation point. The operation point includes a rotation speed of the engine and a load factor of the engine. The first relationship is a relationship between the operation point and a load on the secondary battery when the engine is operated at the operation point.

In the deterioration evaluation apparatus for a secondary battery according to the aspect of the disclosure, a degree of deterioration of the secondary battery is evaluated based on a first relationship, and the first relationship is set by using an accelerator operation amount and an operation point including a rotation speed of the engine and a load factor of the engine and is a relationship between the operation point and a load on the secondary battery when the engine is operated at the operation point. A degree of deterioration of the secondary battery is evaluated by using the operation point of the engine, so a degree of deterioration of the secondary battery is further accurately evaluated.

In the deterioration evaluation apparatus for a secondary battery according to the aspect of the disclosure, the one or more processors may be configured to evaluate the degree of deterioration by comparing the first relationship with an evaluation relationship that is a relationship between the load on the secondary battery and the operation point determined in advance for each degree of deterioration of the secondary battery. A degree of deterioration is evaluated by using an evaluation relationship determined in advance for each degree of deterioration of the secondary battery, so a degree of deterioration is further properly evaluated.

In the deterioration evaluation apparatus for a secondary battery according to the aspect of the disclosure, the one or more processors may be configured to set the first relationship by using a second relationship and a third relationship, the second relationship may be a relationship between the operation point and an operation frequency that is a frequency with which the engine has been operated at the operation point, and the third relationship may be a relationship between the accelerator operation amount at the operation point and a frequency with which the hybrid vehicle has traveled at the accelerator operation amount. With this configuration, the first relationship can be set by using the operation point and accelerator operation amount of the engine.

In the deterioration evaluation apparatus for a secondary battery according to the aspect of the disclosure, the one or more processors may be configured to evaluate a rate of deterioration of the secondary battery as the degree of deterioration of the secondary battery.

A second aspect of the disclosure relates to a deterioration evaluation method for a secondary battery, which evaluates a degree of deterioration of the secondary battery of a hybrid vehicle including an engine that outputs a driving power, a motor that outputs a driving power, and the secondary battery configured to exchange an electric power with the motor. The deterioration evaluation method includes: setting a first relationship by using an accelerator operation amount and an operation point including a rotation speed of the engine and a load factor of the engine, the first relationship being a relationship between the operation point and a load on the secondary battery when the engine is operated at the operation point; and evaluating a degree of deterioration of the secondary battery based on the first relationship.

The configurations described for the deterioration evaluation apparatus for a secondary battery may also be configured as degradation evaluation methods for a secondary battery.

BRIEF DESCRIPTION OF THE DRAWINGS

Features, advantages, and technical and industrial significance of exemplary embodiments will be described below with reference to the accompanying drawings, in which like signs denote like elements, and wherein.

DETAILED DESCRIPTION OF EMBODIMENTS

An embodiment of the disclosure will be described.

Figure 1:
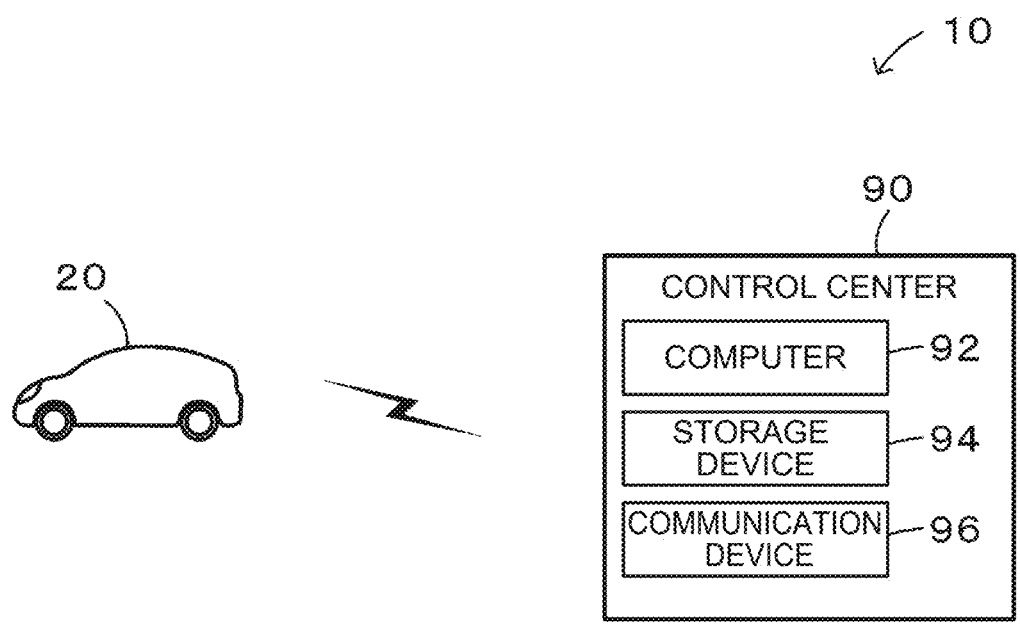
FIG. 1 is a configuration diagram schematically showing the configuration of a vehicle diagnosis system including a deterioration evaluation apparatus for a secondary battery as one embodiment.

FIG. 1 is a configuration diagram schematically showing the configuration of a vehicle diagnosis system including a deterioration evaluation apparatus for a secondary battery as one embodiment. As shown in the drawing, the vehicle diagnosis system 10 includes a hybrid vehicle 20 and a control center 90.

Figure 2:
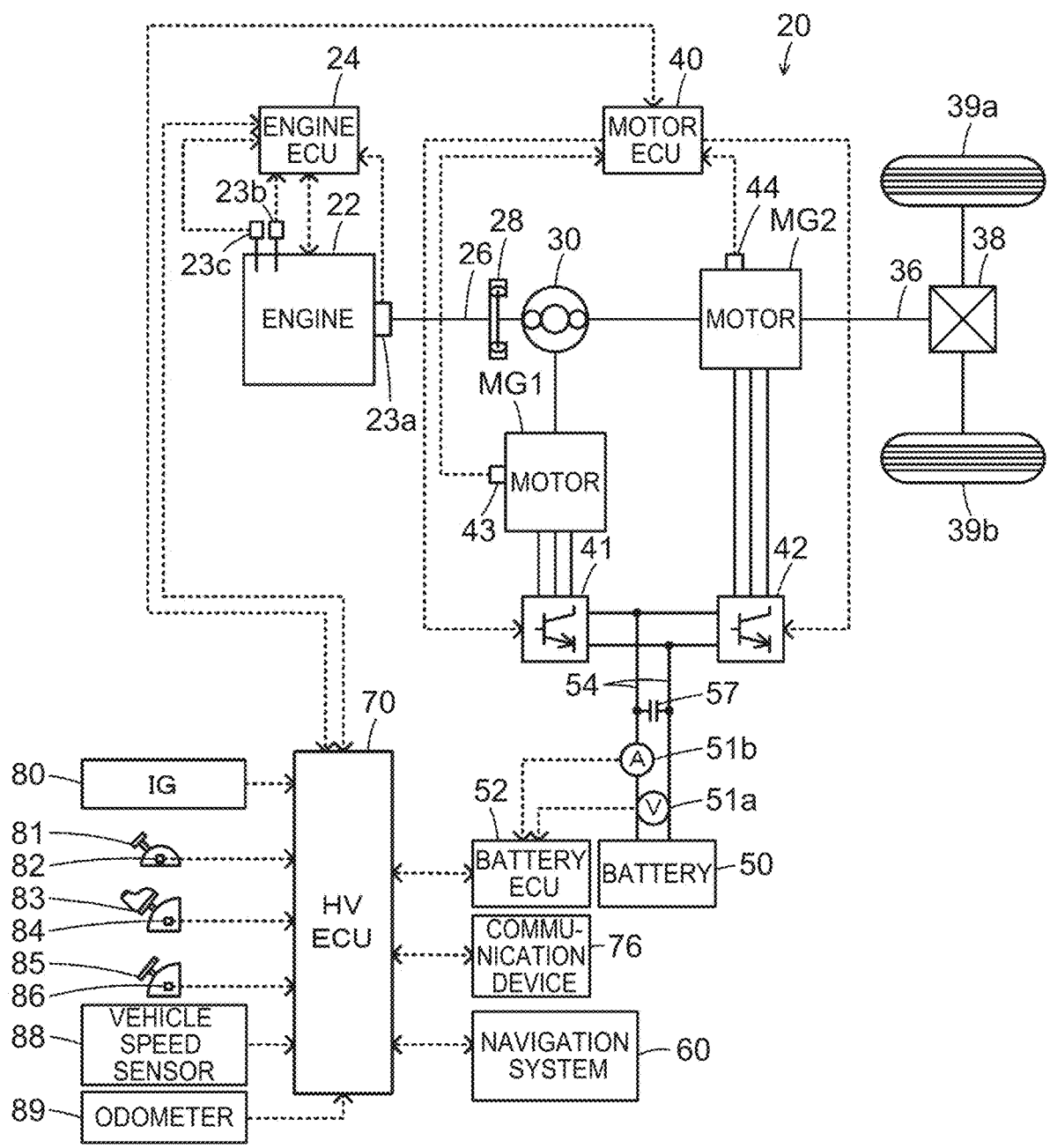
FIG. 2 is a configuration diagram schematically showing the configuration of a hybrid vehicle.

FIG. 2 is a configuration diagram schematically showing the configuration of the hybrid vehicle 20. As shown in the drawing, the hybrid vehicle 20 includes an engine 22, a planetary gear 30, motors MG1, MG2, inverters 41, 42, a battery 50, a navigation system 60, and a hybrid electronic control unit (hereinafter, referred to as HVECU) 70.

The engine 22 is an internal combustion engine that outputs a power by using gasoline, light oil, or the like as a fuel. The engine 22 is connected to the carrier of the planetary gear 30 via a damper 28. The operation of the engine 22 is controlled by an engine electronic control unit (hereinafter, referred to as engine ECU) 24.

Although not shown in the drawing, the engine ECU 24 is configured as a microprocessor that mainly includes a CPU and that, in addition to the CPU, further includes a ROM that stores process programs, a RAM that temporarily stores data, input and output ports, and a communication port. Signals required to control the operation of the engine 24 are input from various sensors to the engine ECU 24 via the input port. Examples of the signals that are input to the engine ECU 24 include a crank angle θcr from a crank position sensor 23a, and a coolant temperature Tw from a coolant temperature sensor 23b. The crank position sensor 23a detects the rotation position of a crankshaft 26 of the engine 22. The coolant temperature sensor 23b detects the temperature of coolant of the engine 22. Examples of the signals that are input to the engine ECU 24 further include an intake pressure Pi from an intake pressure sensor 23c, and an intake air volume Qa from an air flow meter (not shown). The intake pressure sensor 23c detects the intake pressure of the engine 22. The air flow meter detects the intake air volume of the engine 22. Various control signals for controlling the operation of the engine 22 are output from the engine ECU 24 via the output port. The engine ECU 24 computes the rotation speed Ne of the engine 22 based on the crank angle θcr from the crank position sensor 23. The engine ECU 24 computes a load factor KL (the ratio of the volume of air actually taken in per one cycle to a piston displacement per one cycle of the engine 22) based on an intake air volume Qa, detected by the air flow meter, and the rotation speed Ne.

The planetary gear 30 is configured as a single-pinion planetary gear train. The rotor of the motor MG1 is connected to the sun gear of the planetary gear 30. A drive shaft 36 coupled to drive wheels 39a, 39b via a differential gear 38 is connected to a ring gear of the planetary gear 30. The crankshaft 26 of the engine 22 is connected to the carrier of the planetary gear 30 via a damper 28.

The motor MG1 is, for example, a synchronous generator-motor. As described above, the rotor of the motor MG1 is connected to the sun gear of the planetary gear 30. The motor MG2 is, for example, a synchronous generator-motor. The rotor of the motor MG2 is connected to the drive shaft 36. The inverters 41, 42 are used to drive the motors MG1, MG2, respectively. The inverters 41, 42 each are connected to the battery 50 via power lines 54. A smoothing capacitor 57 is connected to the power lines 54. Each of the motors MG1, MG2 is driven for rotation by a motor electronic control unit (hereinafter, referred to as motor ECU) 40 executing switching control over multiple switching elements (not shown) of an associated one of the inverters 41, 42.

Although not shown in the drawing, the motor ECU 40 is a microprocessor that mainly includes a CPU and that, in addition to the CPU, further includes a ROM that stores process programs, a RAM that temporarily stores data, input and output ports, and a communication port. Signals from various sensors required to control the drive of the motors MG1, MG2 are input to the motor ECU 40. Examples of the signals from various sensors include rotation positions θm1, θm2 from rotation position detection sensors 43, 44 via the input port. The rotation position detection sensors 43, 44 respectively detect the rotation positions of the rotors of the motors MG1, MG2. Switching control signals and the like are output from the motor ECU 40 to the multiple switching elements of the inverters 41, 42 via the output port. The motor ECU 40 is connected to the HVECU 70 via the communication port.

The battery 50 is, for example, a lithium ion secondary battery or a nickel-metal hydride secondary battery and connected to the power lines 54. The battery 50 is managed by a battery electronic control unit (hereinafter, referred to as battery ECU) 52.

Although not shown in the drawing, the battery ECU 52 is a microprocessor that mainly includes a CPU and that, in addition to the CPU, further includes a ROM that stores process programs, a RAM that temporarily stores data, input and output ports, and a communication port. Signals required to manage the battery 50 are input from various sensors to the battery ECU 52 via the input port. Examples of the signals that are input to the battery ECU 52 include the voltage Vb of the battery 50 from a voltage sensor 51a, and the current Ib of the battery 50 from a current sensor 51b. The voltage sensor Ma is connected between the terminals of the battery 50. The current sensor 51b is connected to the output terminal of the battery 50. The battery ECU 52 is connected to the HVECU 70 via the communication port.

Although not shown in the drawing, the navigation system 60 includes a main body, a GPS antenna, and a touch panel display. The main body incorporates a storage medium, such as a hard disk drive in which map information and the like are stored, and a control unit having input and output ports and a communication port. The GPS antenna receives information about the current position of a host vehicle. The touch panel display shows various pieces of information, such as information about the current position of the host vehicle and scheduled travel route to a destination, and allows a user to input various instructions. Service information (for example, sightseeing information, parking places, and the like), road information about travel sections (for example, a road between traffic lights, a road between intersections, and the like), and other information are stored in the map information as a database. The road information contains distance information, width information, lane count information, area information (an urban area or a suburban area), category information (an ordinary road or an expressway), gradient information, legal speed, the number of traffic lights, and the like. Information about the current position of the host vehicle includes current position information Gp including the latitude and longitude of the current position. The navigation system 60 is connected to the HVECU 70 via the communication port.

Although not shown in the drawing, the HVECU 70 is a microprocessor that mainly includes a CPU and that, in addition to the CPU, further includes a ROM that stores process programs, a RAM that temporarily stores data, a nonvolatile memory that stores data, input and output ports, and a communication port.

Signals from various sensors are input to the HVECU 70 via the input port. Examples of the signals that are input to the HVECU 70 include an ignition signal from an ignition switch 80 and a shift position SP from a shift position sensor 82. The shift position sensor 82 detects the operating position of a shift lever 81. Examples of the signals that are input to the HVECU 70 also include an accelerator operation amount Acc (0% when an accelerator pedal 83 is not depressed) from an accelerator pedal position sensor 84, a brake pedal position BP from a brake pedal position sensor 86, a vehicle speed V from a vehicle speed sensor 88, and a travel distance D from an odometer 89. The accelerator pedal position sensor 84 detects the depression amount of the accelerator pedal 83. The brake pedal position sensor 86 detects the depression amount of a brake pedal 85. The vehicle speed sensor 88 detects the vehicle speed V. The odometer 89 detects a cumulative travel distance from completion of a vehicle to a current point in time. Furthermore, signals including the current position information Gp and the like are input from the navigation system 60 via the input port.

As described above, the HVECU 70 is connected to the engine ECU 24, the motor ECU 40, and the battery ECU 52 via the communication port.

The communication device 76 communicates between the HVECU 70 and an external device.

The thus configured hybrid vehicle 20 of the embodiment runs in an electric mode (EV mode) or a hybrid mode (HV mode). In the electric mode (EV mode), the hybrid vehicle 20 runs without operating the engine 22. In the hybrid mode (HV mode), the hybrid vehicle 20 runs while operating the engine 22.

The control center 90 includes a computer 92 that serves as a management server, a storage device 94, and a communication device 96. The computer 92, in addition to the CPU, includes a ROM that stores process programs, a RAM that temporarily stores data, input and output ports, and a communication port. The storage device 94 is configured as, for example, a hard disk drive, an SSD, or the like. The storage device 94 stores the same map information as the map information stored in the navigation system 60 of the hybrid vehicle 20. The communication device 96 communicates with the communication device 76 of the hybrid vehicle 20. The computer 92, the storage device 94, and the communication device 96 are connected to one another via a signal line.

Figure 3:
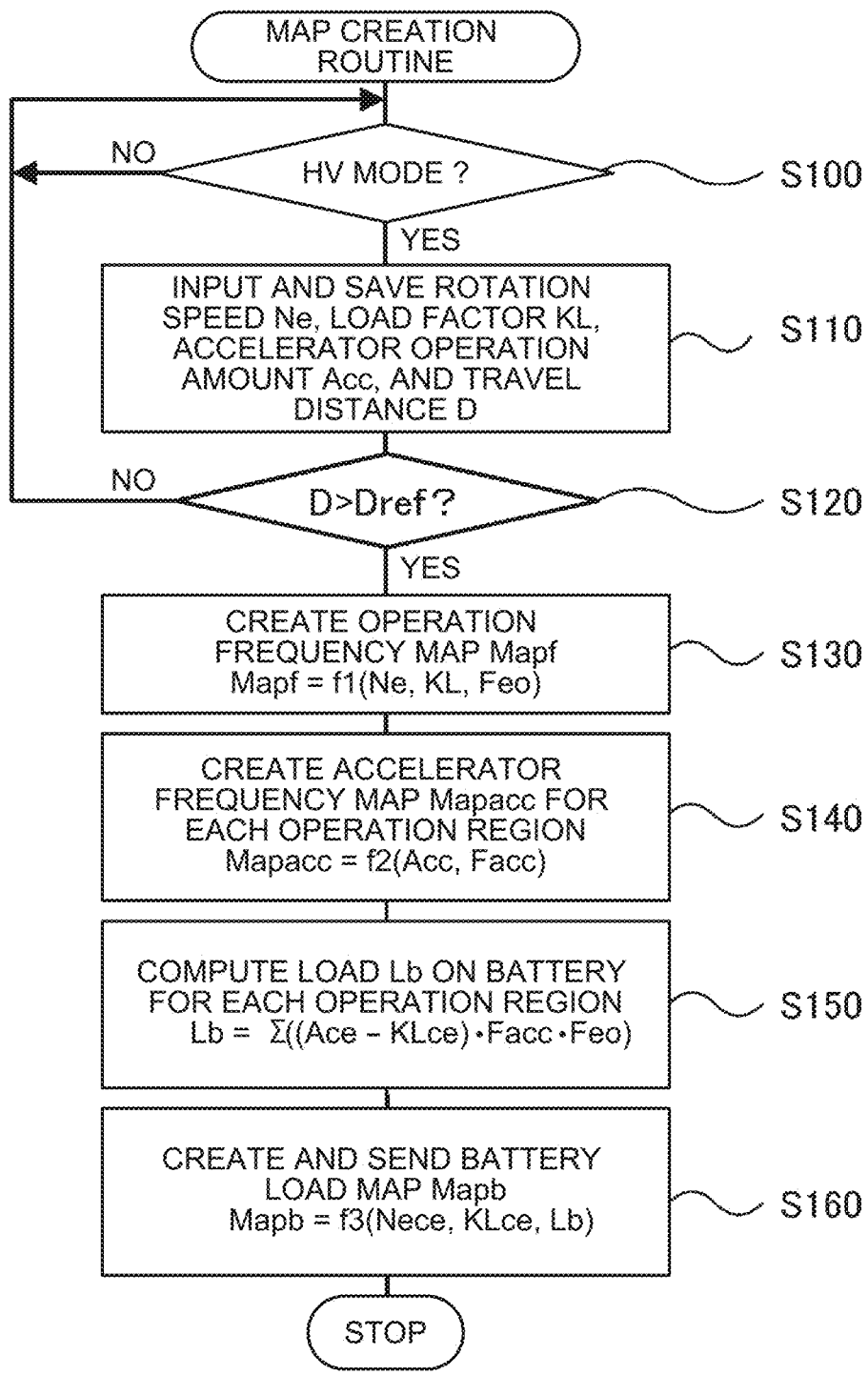
FIG. 3 is a flowchart showing an example of a map creation routine executed by an HVECU of the hybrid vehicle.

Next, the operation of the thus configured vehicle diagnosis system 10 of the embodiment, specifically, the operation at the time when the hybrid vehicle 20 computes an available travel distance Dab that can be travelled until the end of the life of the battery 50, will be described. FIG. 3 is a flowchart showing an example of a map creation routine executed by the HVECU 70 of the hybrid vehicle 20. The map creation routine is executed when the hybrid vehicle 20 begins to be used (for example, when the hybrid vehicle 20 is shipped from a factory and then the system is started up, or when a user purchases the hybrid vehicle 20 and then the system is started up for the first time).

When the map creation routine is executed, the CPU of the HVECU 70 determines whether the hybrid vehicle 20 is running in the HV mode (step S100). When the hybrid vehicle 20 is not running in the HV mode, determination of step S100 is repeated until the hybrid vehicle 20 runs in the HV mode.

When it is determined in step S100 that the drive mode is the HV mode, the rotation speed Ne and load factor KL of the engine 22, the accelerator operation amount Acc, and the travel distance D are input and saved in the nonvolatile memory (step S110). The rotation speed Ne and load factor KL computed by the engine ECU 24 are input through communication. The accelerator operation amount Acc detected by the accelerator pedal position sensor 84 is input. The travel distance D detected by the odometer 89 is input. The rotation speed Ne, the load factor KL, and the accelerator operation amount Acc are saved in the nonvolatile memory.

When data is input in this way, it is determined whether the travel distance D exceeds a predetermined distance Dref (step S120). The predetermined distance Dref is determined in advance as an interval at which a battery load map Mapb (described later) is created, and is a distance generally recognized as an annual average of travel distance of a vehicle, for example, 8000 km, 10000 km, 12000 km, or the like. The predetermined distance Dref may be not an annual average of travel distance of a vehicle and may be determined as needed.

When the travel distance D is shorter than or equal to the predetermined distance Dref, the process returns to step S100, and step S100 to step S120 are repeated until the travel distance D exceeds the predetermined distance Dref. Therefore, when the hybrid vehicle 20 is running in the HV mode, the HVECU 70 saves the rotation speed Ne, the load factor KL, and the accelerator operation amount Acc in the nonvolatile memory as time-series data until the travel distance D exceeds the predetermined distance Dref. In the time-series data, a set of rotation speed Ne, load factor KL, and accelerator operation amount Acc are saved in the nonvolatile memory in association with one another.

Figure 4:
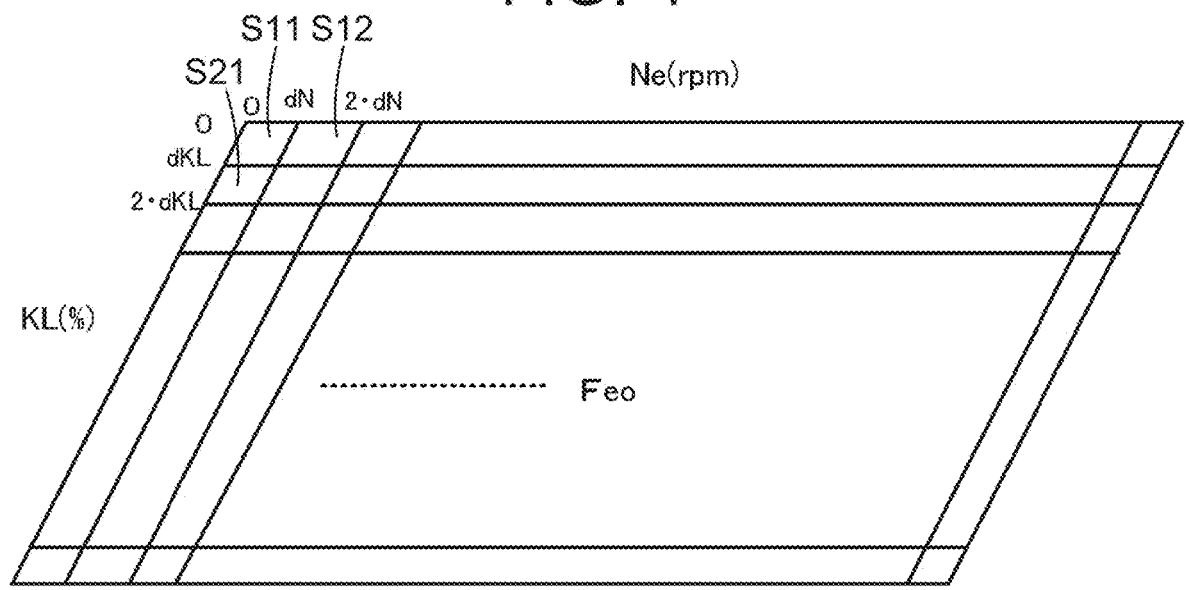
FIG. 4 is a graph showing an example of an operation frequency map.

When the travel distance D exceeds the predetermined distance Dref in step S120, the HVECU 70 creates an operation frequency map (second relationship) Mapf by using the rotation speeds Ne and load factors KL of the time-series data stored in the nonvolatile memory (step S130). The operation frequency map Mapf is a map that shows the relationship between an operation point including the rotation speed Ne and load factor KL of the engine 22, and an operation frequency Feo of the engine 22 at each operation point in a period during which the hybrid vehicle 20 travels the predetermined distance Dref. FIG. 4 shows an example of the operation frequency map Mapf. The operation frequency map Mapf is created by grouping rotation speeds Ne and load factors KL that can be taken by the engine 22 during operation of the engine 22 into a plurality of operation regions S11 to Snm ("n" and "m" each are a natural number greater than or equal to one) for every predetermined rotation speed dN (for example, every 200 rpm, 400 rpm, 600 rpm, or the like) and every predetermined load factor dKL (for example, every 4%, 5%, 6%, or the like) and then the operation frequency (operation count) Feo of the engine 22 at each set of rotation speed Ne and load factor KL included in each of the operation regions S11 to Snm is derived from the time-series data.

Figure 5:
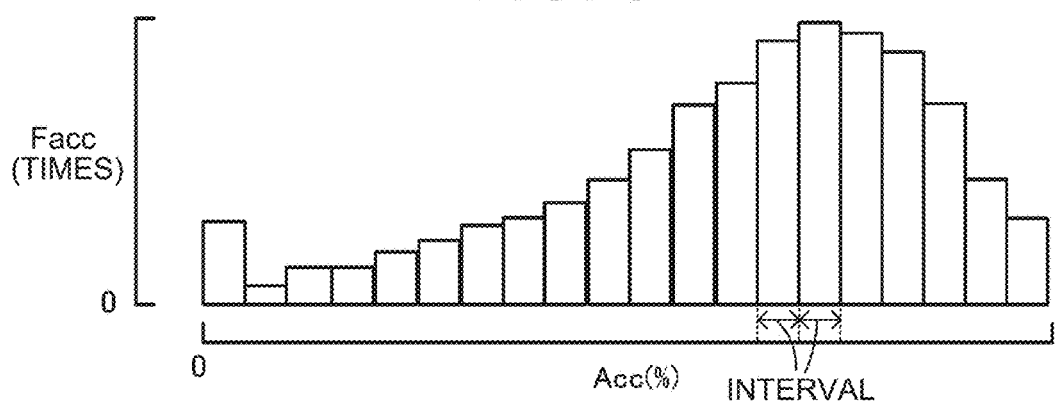
FIG. 5 is a graph showing an example of an accelerator frequency map.

Subsequently, the HVECU 70 creates an accelerator frequency map Mapacc (third relationship) for each of the operation regions S11 to Snm by using the accelerator operation amount Acc stored in association with each set of rotation speed Ne and load factor KL of the time-series data stored in the nonvolatile memory (step S140). The accelerator frequency map Mapacc is a map that shows the relationship between an accelerator operation amount Acc at each operation point and a frequency (count) Facc with which the hybrid vehicle 20 has travelled at the accelerator operation amount Acc. FIG. 5 shows an example of the accelerator frequency map Mapacc in an operation region. The accelerator frequency map Mapacc is created by grouping accelerator operation amounts Acc that can be taken during operation of the engine 22 into intervals of a predetermined opening dAcc (for example, 2%, 5%, 10%, or the like) and deriving a count (frequency) with which the accelerator operation amount Acc becomes an operation amount in each interval for each of the operation regions S11 to Snm from the time-series data.

When the HVECU 70 creates the accelerator frequency map Mapacc for each of the operation regions S11 to Snm in this way, the HVECU 70 computes a load Lb on the battery 50 for each of the operation regions S11 to Snm by using the accelerator frequency map Mapacc and the operation frequency map Mapf (step S150). In computing a load Lb, a median value KLc of load factors KL and operation frequency Feo in an operation region with which the accelerator frequency map Mapacc is associated among the operation regions Si 1 to Snm are derived. Then, for each interval of the accelerator frequency map Mapacc, a load Lbs (=(Ace−KLce)·Facc·Feo) on the battery 50 in each interval is computed by multiplying the frequency Facc and the operation frequency Feo by a value obtained by subtracting the median value KLce of the associated operation region from the median value Ace of the accelerator operation amount Acc. A load Lb is computed by accumulating the thus computed load Lbs in each interval.

Figure 6:
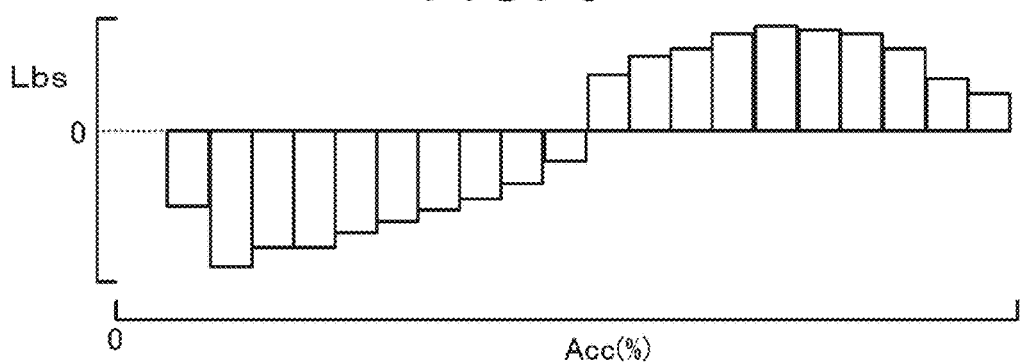
FIG. 6 is a graph showing an example of a load in each section.

The reason why the load Lbs is computed as described above is as follows. The accelerator operation amount Acc reflects a required power required of a vehicle, and the load factor KL reflects a power output from the engine 22, so a value obtained by subtracting the load factor KL from the accelerator operation amount Acc is a value that reflects a power output from the motor MG2, that is, an electric power output from the battery 50. The frequency Facc is a frequency (count) with which the hybrid vehicle 20 has traveled at the associated accelerator operation amount Acc, and is a value that reflects a time during which the hybrid vehicle 20 has traveled at the associated accelerator operation amount Acc. Therefore, the value obtained by multiplying the frequency Facc by the value obtained by subtracting the load factor KL from the accelerator operation amount Acc is a value that reflects the amount of electric power output from the battery 50 (a load on the battery 50). Each map is a histogram, so the load Lbs in each interval is computed by multiplying the frequency Facc by the value obtained by subtracting the median value KLce of load factors KL of the associated operation region from the median value Ace of the accelerator operation amounts Acc. FIG. 6 is a graph showing an example of a load Lbs in each interval. When, for example, the median value Ace is 30%, the load factor KL is 20%, and the frequency Facc is 100, the load Lbs is a value obtained by multiplying a value of 100 by a value obtained by subtracting a value of 20 from a value of 30 (=(30−20)·100).

When the HVECU 70 computes a load Lbs in each interval, the HVECU 70 regards the sum (=ΣLbs) of the loads Lbs in each interval as a load Lb. The thus computed load Lbs is a value that reflects a load on the battery 50 in each operation region (how the battery 50 is used).

Figure 7:
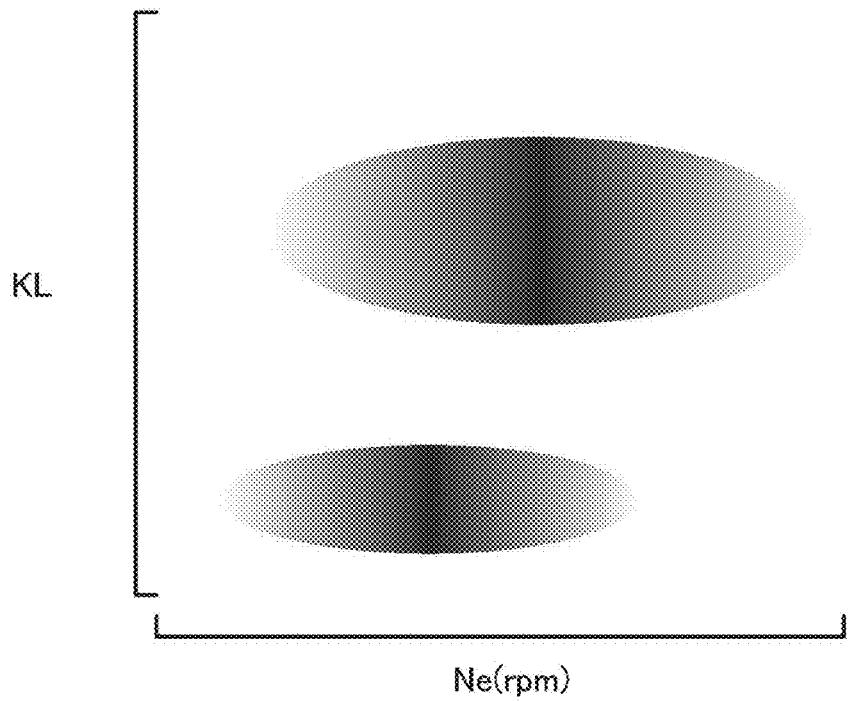
FIG. 7 is a graph showing an example of a battery load map.

When the HVECU 70 computes a load Lb in each operation region, the HVECU 70 creates a battery load map (first relationship) Mapb by using the rotation speed Ne and load factor KL of the engine 22 and the load Lb in each operation region, sends the created battery load map Mapb to the communication device 96 of the control center 90 via the communication device 76 (step S160), and ends the map creation routine. The battery load map Mapb is a map that shows the relationship between an operation point including the rotation speed Ne and load factor KL of the engine 22, and a load Lb on the battery 50 at each operation point. FIG. 7 is a graph showing an example of the battery load map Mapb. In the drawing, the magnitude of the load Lb on the battery 50 is represented by light and shade, and the ones in a thick color have a greater load Lb than the ones in a light color. The CPU of the HVECU 70 of the hybrid vehicle 20, which has sent the battery load map Mapb to the control center 90, may clear the time-series data saved in the nonvolatile memory. With this configuration, time-series data does not need to be stored further longer, so the storage capacity of the nonvolatile memory is reduced as compared to a configuration in which time-series data is held until a lapse of the durable years of the hybrid vehicle 20.

Figure 8:
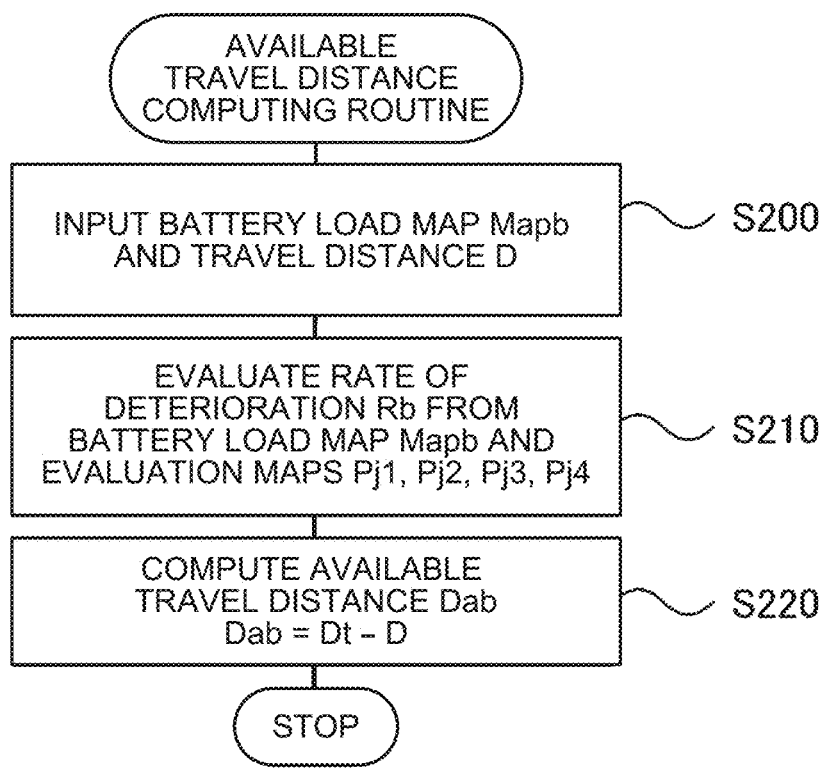
FIG. 8 is a flowchart showing an example of an available travel distance computing routine executed by a computer of a control center.

The computer 92 of the control center 90, which has received the battery load map Mapb via the communication device 96, executes an available travel distance computing routine illustrated in FIG. 8.

When the available travel distance computing routine is executed, the computer 92 of the control center 90 executes a process of inputting the battery load map Mapb and the travel distance D (step S200). A travel distance D is the one detected by the odometer 89 of the hybrid vehicle 20 and is input via the communication device 76 and the communication device 96.

A rate of deterioration Rd as a degree of deterioration of the battery 50 is evaluated by comparing the input battery load map Mapb with evaluation maps Pj1, Pj2, Pj3, Pj4 (step S210).

Figure 9:
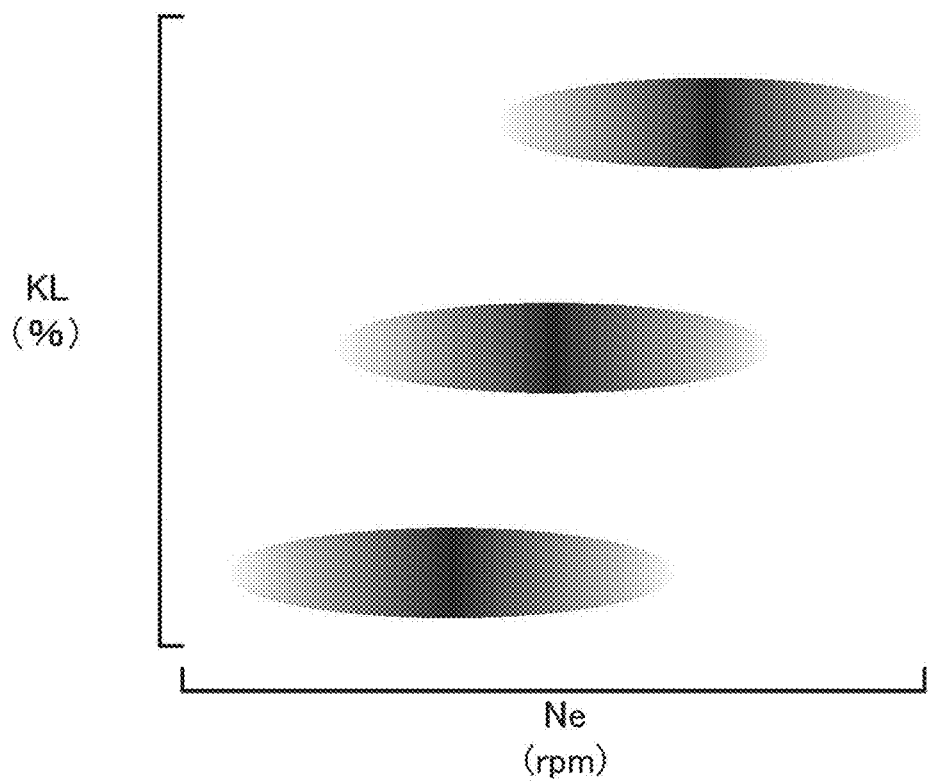
FIG. 9 is a graph showing an example of an evaluation map in the case where the rate of deterioration of a battery is high.
Figure 10:
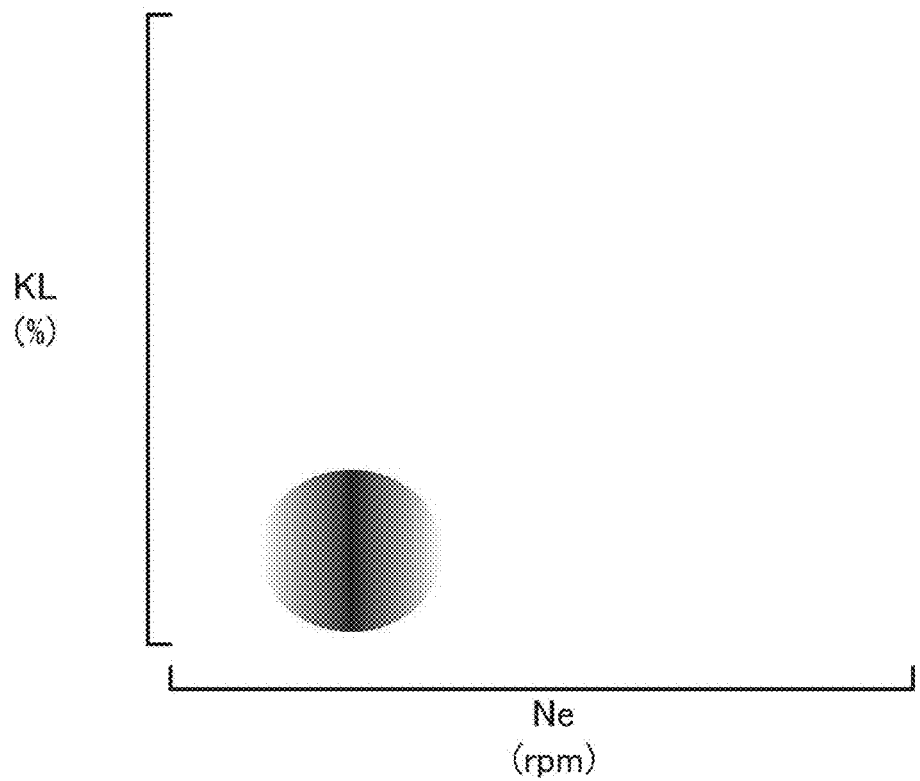
FIG. 10 is a graph showing an example of an evaluation map in the case where the rate of deterioration of a battery is low.
Figure 11:
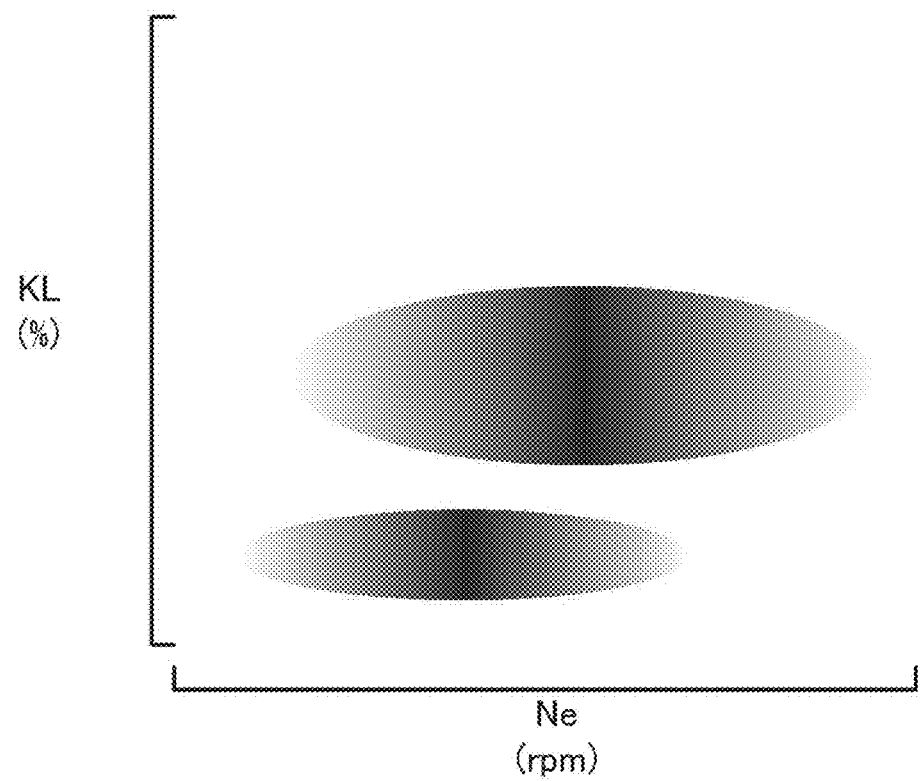
FIG. 11 is a graph showing an example of an evaluation map in the case where the rate of deterioration of a battery is higher than that of the evaluation map for the case where the rate of deterioration is low and is lower than that of the evaluation map for the case where the rate of deterioration is high.
Figure 12:
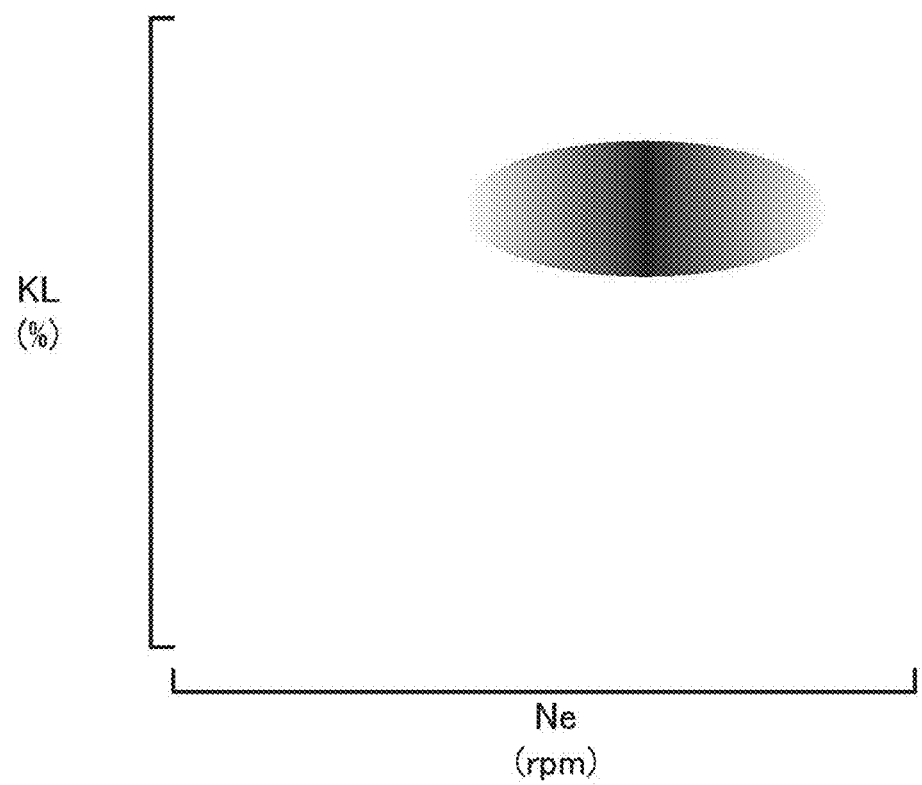
FIG. 12 is a graph showing an example of another evaluation map in the case where the rate of deterioration of a battery is higher than that of the evaluation map for the case where the rate of deterioration is low and is lower than that of the evaluation map for the case where the rate of deterioration is high.

The evaluation maps Pj1, Pj2, Pj3, Pj4 show the relationship between a load Lb on the battery 50 and an operation point according to a rate of deterioration of the battery 50 and are determined in advance by experiment, analysis, or the like. FIG. 9 is a graph showing an example of the evaluation map Pj1 in the case where the rate of deterioration of the battery 50 is high. FIG. 10 is a graph showing an example of the evaluation map Pj2 in the case where the rate of deterioration of the battery 50 is low. FIG. 11 is a graph showing an example of the evaluation map Pj3 in the case where the rate of deterioration of the battery 50 is higher than that of the evaluation map Pj2 and lower than that of the evaluation map Pj1. FIG. 12 is a graph showing an example of the evaluation map Pj4 in the case where the rate of deterioration of the battery 50 is higher than that of the evaluation map Pj2 and lower than that of the evaluation map Pj1. As shown in the graphs, a map varies with the rate of deterioration of the battery 50.

Comparison of the battery load map Mapb with each of the evaluation maps Pj1, Pj2, Pj3, Pj4 is performed by using image recognition process with artificial intelligence (AI) on the assumption that the battery load map Mapb and the evaluation maps Pj1, Pj2, Pj3, Pj4 are images. First, the image of the battery load map Mapb is subjected to a preprocess, such as noise reduction and background elimination, and then subjected to image recognition with AI. Image recognition with AI extracts a feature (for example, two horizontally long ellipses are placed apart from each other in FIG. 7) as the images of loads Lb represented by light and shade. Then, the extracted feature is compared with the features of the evaluation maps Pj1, Pj2, Pj3, Pj4 learned by AI (for example, three horizontally long ellipses are placed apart from one another in the evaluation map Pj1 in FIG. 9, one circle is placed at the bottom left side in the evaluation map Pj2 in FIG. 10, two horizontally long ellipses are placed apart from each other in the evaluation map Pj3 in FIG. 11, one horizontally long ellipse is placed at the top right side in the evaluation map Pj4 in FIG. 12, and the like). When the extracted feature matches any one of the features of the evaluation maps Pj1, Pj2, Pj3, Pj4, it is evaluated that the rate of deterioration Rd of the battery 50 is the rate of deterioration corresponding to the matched evaluation map. Since the battery load map Mapb is set by using the operation point of the engine 22, the rate of deterioration, that is, the degree of deterioration, of the battery 50 is highly accurately evaluated as compared to the configuration in which the rate of deterioration of the battery 50 is evaluated from only the temperature and power of the battery 50 without consideration of the state of operation of the engine 22.

When the rate of deterioration Rd is evaluated in this way, an available travel distance Dab (=Dt–D) that can be traveled until the end of the life of the battery 50 from a current point in time is computed by subtracting the travel distance D input in step S200 from a total available travel distance Dt according to the rate of deterioration Rd (step S220), and then the available travel distance computing routine is ended. A total available travel distance Dt in the case where the rate of deterioration Rd is high is set so as to be longer than a total available travel distance Dt in the case where the rate of deterioration Rd is low. Through the above process, an available travel distance Dab that can be traveled until the battery 50 deteriorates from a current point in time is computed. The control center 90 periodically receives a travel distance D from the hybrid vehicle 20 and, when the travel distance of the hybrid vehicle 20 reaches the available travel distance Dab, determines that the battery 50 reaches the end of the life and sends information to the hybrid vehicle 20 to prompt replacement of the battery 50. In the hybrid vehicle 20 that has received information prompting replacement of the battery 50, information prompting replacement of the battery 50 is displayed on a display in a vehicle cabin (not shown), thus making it possible to prompt a user to replace the battery 50.

With the above-described vehicle diagnosis system 10 including the deterioration evaluation apparatus for a secondary battery according to the embodiment, the rate of deterioration (degree of deterioration) of the battery 50 is evaluated based on the battery load map Mapb. The battery load map Mapb is set by using an accelerator operation amount Acc and an operation point including the rotation speed Ne and load factor KL of the engine 22. The battery load map Mapb is the relationship between an operation point and a load Lb on the battery 50 when the engine 22 is operated at the operation point. Thus, the rate of deterioration of the battery 50 is further accurately evaluated.

A rate of deterioration is evaluated by comparing the battery load map Mapb with each of the evaluation maps Pj1, Pj2, Pj3, Pj4, each of which is the relationship between a load Lb on the battery 50 and an operation point determined in advance for each rate of deterioration of the battery 50. Thus, a rate of deterioration is further properly evaluated.

The battery load map Mapb is created by using the operation frequency map Mapf and the accelerator frequency map Mapacc. The operation frequency map Mapf is the relationship between an operation point of the engine 22 and an operation frequency Feo that is a frequency with which the engine 22 has been operated at the operation point. The accelerator frequency map Mapacc is the relationship between an accelerator operation amount Acc at an operation point and a frequency Facc with which the hybrid vehicle 20 has traveled at the accelerator operation amount Acc. Thus, the battery load map Mapb is created by using an operation point of the engine 22 and an accelerator operation amount Acc.

In the vehicle diagnosis system 10 including the deterioration evaluation apparatus for a secondary battery according to the embodiment, in step S210 of the available travel distance computing routine illustrated in FIG. 8, the rate of deterioration Rd is evaluated by comparing the battery load map Mapb with each of the evaluation maps Pj1, Pj2, Pj3, Pj4 shown in FIG. 9 to FIG. 12. However, the evaluation maps Pj1, Pj2, Pj3, Pj4 are not limited to those shown in FIG. 9 to FIG. 12, and an evaluation map for comparison with the battery load map Mapb may be determined as needed according to the specifications or the like of the hybrid vehicle 20 and battery 50.

In the vehicle diagnosis system 10 including the deterioration evaluation apparatus for a secondary battery according to the embodiment, in step S220 of the available travel distance computing routine illustrated in FIG. 8, the available travel distance Dab is computed by subtracting the travel distance D from the total available travel distance Dt. Alternatively, a value corrected based on the current position information Gp of the hybrid vehicle 20 from a value obtained by subtracting the travel distance D from the total available travel distance Dt may be used as the available travel distance Dab. Since the life of the battery 50 tends to be shorter as the ambient temperature increases, when the hybrid vehicle 20 is traveling in an area with high-temperature climate based on the current position information Gp, the available travel distance Dab may be shortened as compared to when the hybrid vehicle 20 is traveling in an area with low-temperature climate.

In the vehicle diagnosis system 10 including the deterioration evaluation apparatus for a secondary battery according to the embodiment, in step S220 of the available travel distance computing routine illustrated in FIG. 8, the available travel distance Dab that can be traveled until the end of the lift of the battery 50 from present time is computed. Instead of the available travel distance Dab, a period of time taken until the end of the life of the battery 50 from present time may be computed. In this case, the relationship between a rate of deterioration Rd and a period of time taken until the end of the life of the battery 50 from present time may be determined in advance, and a period of time taken until the end of the life of the battery 50 may be derived from the relationship by using a rate of deterioration Rd.

In the vehicle diagnosis system 10 including the deterioration evaluation apparatus for a secondary battery according to the embodiment, the HVECU 70 of the hybrid vehicle 20 executes the map creation routine of FIG. 3, and the computer 92 of the control center 90 executes the available travel distance computing routine of FIG. 8. However, part of the map creation routine of FIG. 3 may be executed in the control center 90, and part of the available travel distance computing routine of FIG. 8 may be executed in the HVECU 70 of the hybrid vehicle 20.

In the embodiment, the case where the deterioration evaluation apparatus for a secondary battery according to the aspect of the disclosure is applied to the hybrid vehicle 20 including the engine 22, the motors MG1, MG2, and the planetary gear 30 is illustrated. However, the configuration is not limited to the thus configured hybrid vehicle 20. As long as a hybrid vehicle includes an engine that outputs a driving power, a motor that outputs a driving power, and a secondary battery that exchanges an electric power with the motor, the deterioration evaluation apparatus for a secondary battery according to the aspect of the disclosure may be applied to the hybrid vehicle 20 having a different configuration. Also, the deterioration evaluation apparatus for a secondary battery according to the aspect of the disclosure may also be applied to a vehicle different from an automobile, for example, a train or a construction machine.

The correspondence relation between major elements of the embodiment and major elements of the disclosure described in Summary will be described. In the embodiment, the engine 22 may be regarded as the engine, the motor MG2 may be regarded as the motor, the battery 50 may be regarded as the secondary battery, and the computer 92 of the control center 90 may be regarded as the one or more processors.

The correspondence relation between major elements of the embodiment and major elements of the disclosure described in Summary does not limit the elements of the disclosure described in the Summary since the embodiment is an example for specifically describing the aspects of the disclosure described in the Summary. In other words, the disclosure described in the Summary should be interpreted based on the description therein, and the embodiment is only a specific example of the disclosure described in the Summary.

The embodiment of the disclosure is described above; however, the disclosure is not limited to the embodiment and may be, of course, modified into various forms without departing from the scope of the disclosure.

The disclosure is usable in the industry of manufacturing a deterioration evaluation apparatus for a secondary battery and other industries.

What is claimed is:

1. A deterioration evaluation apparatus for a secondary battery, which evaluates a degree of deterioration of the secondary battery of a hybrid vehicle including an engine that outputs a driving power, a motor that outputs a driving power, and the secondary battery configured to exchange an electric power with the motor, the deterioration evaluation apparatus comprising:
one or more processors configured to:
evaluate the degree of deterioration of the secondary battery based on an artificial intelligence image recognition process performed between a battery load map included in a first relationship and one or more evaluation maps, the first relationship being set by (i) using an accelerator operation amount and an operation point, the operation point including a rotation speed of the engine and a load factor of the engine, the first relationship being a relationship between the operation point and a load on the secondary battery when the engine is operated at the operation point, and (ii) using a second relationship and a third relationship, the second relationship being a relationship between the operation point and an operation frequency that is a frequency with which the engine has been operated at the operation point, and the third relationship being a relationship between the accelerator operation amount at the operation point and a frequency with which the hybrid vehicle has traveled at the accelerator operation amount,
determine, based on the evaluation of the degree of deterioration of the secondary battery, whether the secondary battery reaches an end of life,
based on a determination the secondary battery reaches the end of life, transmit a notification to the hybrid vehicle indicating the secondary battery has reached the end of life and causing the vehicle to display a status of the secondary battery.

2. The deterioration evaluation apparatus according to claim 1, wherein the one or more processors are configured to evaluate the degree of deterioration by comparing the first relationship with an evaluation relationship that is a relationship between the load on the secondary battery and the operation point determined in advance for each degree of deterioration of the secondary battery.

3. The deterioration evaluation apparatus according to claim 1, wherein the one or more processors are configured to evaluate a rate of deterioration of the secondary battery as the degree of deterioration of the secondary battery.

4. A deterioration evaluation method for a secondary battery, which evaluates a degree of deterioration of the secondary battery of a hybrid vehicle including an engine that outputs a driving power, a motor that outputs a driving power, and the secondary battery configured to exchange an electric power with the motor, the deterioration evaluation method comprising:

setting a first relationship by (i) using an accelerator operation amount and an operation point including a rotation speed of the engine and a load factor of the engine, the first relationship being a relationship between the operation point and a load on the secondary battery when the engine is operated at the operation point, and (ii) using a second relationship and a third relationship, the second relationship is a relationship between the operation point and an operation frequency that is a frequency with which the engine has been operated at the operation point, and the third relationship is a relationship between the accelerator operation amount at the operation point and a frequency with which the hybrid vehicle has traveled at the accelerator operation amount;

evaluating the degree of deterioration of the secondary battery based on an artificial intelligence image recognition process performed between a battery load map included in the first relationship and one or more evaluation maps;

determining, based on the evaluation of the degree of deterioration of the secondary battery, whether the secondary battery reaches an end of life; and based on a determination the secondary battery reaches the end of life, transmitting a notification to the hybrid vehicle indicating the secondary battery has reached the end of life and causing the vehicle to display a status of the secondary battery.

5. The deterioration evaluation method according to claim 4, wherein the degree of deterioration is evaluated by comparing the first relationship with an evaluation relationship that is a relationship between the load on the secondary battery and the operation point determined in advance for each degree of deterioration of the secondary battery.

6. The deterioration evaluation method according to claim 4, wherein a rate of deterioration of the secondary battery is evaluated as the degree of deterioration of the secondary battery.

* * * * *